United States Patent
Bean, Jr. et al.

(10) Patent No.: US 8,256,305 B2
(45) Date of Patent: Sep. 4, 2012

(54) SYSTEM AND METHOD FOR AIR CONTAINMENT ZONE PRESSURE DIFFERENTIAL DETECTION

(75) Inventors: John H. Bean, Jr., Wentzville, MO (US); Ozan Tutunoglu, O'Fallon, MO (US); Daniel J. Rohr, Wildwood, MO (US)

(73) Assignee: American Power Conversion Corporation, West Kingston, RI (US)

( * ) Notice: Subject to any disclaimer, the term of this patent is extended or adjusted under 35 U.S.C. 154(b) by 129 days.

(21) Appl. No.: 12/886,954

(22) Filed: Sep. 21, 2010

(65) Prior Publication Data
US 2012/0067136 A1    Mar. 22, 2012

(51) Int. Cl.
*G01F 1/28* (2006.01)
(52) U.S. Cl. .................................. 73/861.75
(58) Field of Classification Search ............... 73/861.75, 73/861.74; 137/518
See application file for complete search history.

(56) References Cited

U.S. PATENT DOCUMENTS

| | | | |
|---|---|---|---|
| 4,206,644 A | 6/1980 | Platt | |
| 4,317,374 A | 3/1982 | Casey | |
| 4,561,309 A * | 12/1985 | Rosner | 73/705 |
| 4,694,849 A * | 9/1987 | Rampen | 137/312 |
| 5,581,478 A | 12/1996 | Cruse et al. | |
| 5,718,628 A | 2/1998 | Nakazato et al. | |
| 5,910,045 A | 6/1999 | Aoki et al. | |
| 6,034,873 A | 3/2000 | St.ang.hl et al. | |
| 6,535,382 B2 | 3/2003 | Bishop et al. | |
| 6,574,104 B2 | 6/2003 | Patel et al. | |
| 6,574,970 B2 | 6/2003 | Spinazzola et al. | |
| 6,616,524 B2 | 9/2003 | Storck, Jr. et al. | |
| 6,672,955 B2 | 1/2004 | Charron | |
| 6,722,151 B2 | 4/2004 | Spinazzola et al. | |
| 6,745,579 B2 | 6/2004 | Spinazzola et al. | |
| 6,775,137 B2 | 8/2004 | Chu et al. | |
| 6,819,563 B1 | 11/2004 | Chu et al. | |
| 6,851,255 B2 * | 2/2005 | Aitchison et al. | 60/39.83 |
| 6,859,366 B2 | 2/2005 | Fink | |
| 6,924,981 B2 | 8/2005 | Chu et al. | |
| 6,980,433 B2 | 12/2005 | Fink | |
| 7,031,870 B2 | 4/2006 | Sharma et al. | |
| 7,046,514 B2 | 5/2006 | Fink et al. | |

(Continued)

FOREIGN PATENT DOCUMENTS

DE     196 05 285 C1    3/1997

(Continued)

OTHER PUBLICATIONS

International Search Report for PCT/US2011/049050 mailed Feb. 1, 2012.

*Primary Examiner* — Jewel V Thompson
(74) *Attorney, Agent, or Firm* — Lando & Anastasi, LLP

(57) ABSTRACT

An air pressure differential sensing system includes a conduit defining an air passage through which air flows upon application of an air pressure differential across different regions of the air passage, a flap pivotally connected to the conduit, and a sensing device mounted proximate to the air passage and separate from the flap. The flap is configured to move about a pivotal axis in response to the air flowing through the air passage. The sensing device is configured to sense an angular position of the flap about the pivotal axis, the angular position of the flap being a function of the air pressure differential.

20 Claims, 8 Drawing Sheets

U.S. PATENT DOCUMENTS

| | | |
|---|---|---|
| 7,051,946 B2 | 5/2006 | Bash et al. |
| 7,096,147 B1 | 8/2006 | Low |
| 7,114,519 B2 * | 10/2006 | Aitchison et al. ............. 137/518 |
| 7,145,772 B2 | 12/2006 | Fink |
| 7,173,820 B2 | 2/2007 | Fink et al. |
| 7,259,963 B2 | 8/2007 | Germagian et al. |
| 7,403,391 B2 | 7/2008 | Germagian et al. |
| 7,500,911 B2 | 3/2009 | Johnson et al. |
| 7,508,663 B2 | 3/2009 | Coglitore |
| 7,520,181 B2 | 4/2009 | Ye et al. |
| 7,596,476 B2 | 9/2009 | Rasmussen et al. |
| 7,752,858 B2 | 7/2010 | Johnson et al. |
| 2001/0042616 A1 | 11/2001 | Baer |
| 2002/0007464 A1 | 1/2002 | Fung |
| 2002/0007643 A1 | 1/2002 | Spinazzola et al. |
| 2002/0059804 A1 | 5/2002 | Spinazzola et al. |
| 2002/0108386 A1 | 8/2002 | Spinazzola et al. |
| 2003/0050003 A1 | 3/2003 | Charron |
| 2003/0235035 A1 | 12/2003 | Wintersteen et al. |
| 2004/0099747 A1 | 5/2004 | Johnson et al. |
| 2004/0100770 A1 | 5/2004 | Chu et al. |
| 2004/0109297 A1 | 6/2004 | Kim et al. |
| 2004/0190247 A1 | 9/2004 | Chu et al. |
| 2004/0240514 A1 | 12/2004 | Bash et al. |
| 2005/0170770 A1 | 8/2005 | Johnson et al. |
| 2005/0225936 A1 | 10/2005 | Day |
| 2005/0237716 A1 | 10/2005 | Chu et al. |
| 2005/0248922 A1 | 11/2005 | Chu et al. |
| 2005/0267639 A1 | 12/2005 | Sharma et al. |
| 2007/0076373 A1 | 4/2007 | Fink |
| 2007/0078635 A1 | 4/2007 | Rasmussen et al. |
| 2007/0121295 A1 | 5/2007 | Campbell et al. |
| 2007/0171613 A1 | 7/2007 | McMahan et al. |
| 2007/0174024 A1 | 7/2007 | Rasmussen et al. |
| 2007/0190919 A1 | 8/2007 | Donovan et al. |
| 2007/0274035 A1 | 11/2007 | Fink et al. |
| 2008/0060372 A1 | 3/2008 | Hillis et al. |
| 2008/0180908 A1 | 7/2008 | Wexler |
| 2008/0198549 A1 | 8/2008 | Rasmussen et al. |
| 2009/0046427 A1 | 2/2009 | Noteboom et al. |
| 2009/0308579 A1 | 12/2009 | Johnson et al. |
| 2010/0131109 A1 | 5/2010 | Rasmussen et al. |
| 2010/0186517 A1 | 7/2010 | Bean, Jr. |

FOREIGN PATENT DOCUMENTS

| | | |
|---|---|---|
| FR | 2 850 750 A1 | 8/2004 |

* cited by examiner

SYSTEM AND METHOD FOR AIR CONTAINMENT ZONE PRESSURE DIFFERENTIAL DETECTION

BACKGROUND OF THE INVENTION

1. Field of the Disclosure

The present disclosure relates to equipment rooms and data centers, and more particularly to methods and systems for managing airflow through equipment racks.

2. Discussion of Related Art

In many equipment room and data center environments, electronic equipment is installed in standardized equipment frames or enclosures called equipment racks, for example as defined by the Electronics Industries Association's EIA-310 specification. A data center may have many equipment racks, often located in close proximity to one another. The electronic equipment may include, for example, servers, network routers, data storage devices, telecommunications equipment, and the like, which generates heat that must be dissipated or otherwise treated to avoid adverse effects on the performance, reliability, and useful life of the equipment. In particular, rack-mounted equipment, housed within the confined space of an enclosure, may be vulnerable to an accumulation of heat within the enclosure. The amount of heat generated by a rack of equipment is related to the amount of electrical power consumed by the equipment, the power efficiency of the equipment, and other factors. Furthermore, over the course of time, various pieces of electronic equipment may be added, removed, replaced, or rearranged to accommodate evolving operational needs, which causes variations in the total amount of heat produced within the data center and within each enclosure.

To protect internal components from overheating, a piece of rack-mounted equipment may include one or more fans for drawing cool air across the components, and expelling heated air into the surrounding environment. Other equipment may manage heat dissipation through thermal convection, or radiational cooling, without the use of any airflow devices. Some equipment racks may include fans to provide supplemental cool air to the equipment mounted therein, or to draw hot air out of the enclosure. Additionally, many data centers provide chilled and conditioned air to augment the cooling requirements of the room.

Each of these cooling techniques consumes additional energy. Because the cooling demands of a data center can vary considerably, it is difficult, using known techniques, to achieve energy efficiency. For example, providing an amount of chilled air in excess of operational requirements wastes energy, whereas costly equipment damage may result from an insufficient supply of cool air.

BRIEF SUMMARY OF THE INVENTION

An aspect of the disclosure is directed to an air pressure differential detecting system for managing airflow in a data center having one or more air containment zones. In one embodiment, the system includes a conduit defining an air passage, a flap pivotally connected within the conduit, and a sensing device mounted proximate to the air passage. Air flows through the air passage when an air pressure differential is applied across different regions of the air passage. The flap is configured to move about a pivotal axis in response to the air flowing through the air passage. The sensing device is configured to sense an angular position of the flap about the pivotal axis. The angular position of the flap is a function of the air pressure differential.

In another embodiment, the sensing device includes a light emitting unit and a plurality of light detectors. The light emitting unit is configured to irradiate at least a portion of the surface of the flap with light. The light is reflected off of the flap, and detected by one or more of the light detectors. The angular position of the flap, which corresponds to a known or calculated air pressure differential, can be determined based on the light detectors receiving the reflected light. Accordingly, the air pressure differential can be determined by sensing the angular position of the flap. The system may include a processing unit coupled to the sensing device and configured to determine the air pressure differential based upon the sensed angular position of the flap.

According to one embodiment, the light emitting unit is a laser. According to another embodiment, at least one of the light detectors is a photodiode.

In another embodiment, the light detectors are arranged such that the sensing device senses the angular position of the flap within a range of angular positions of the flap. The range of angular positions of the flap may correspond to a range of air pressure differentials that is between approximately −0.060 inches of water column and approximately +0.060 inches of water column. The angular position of the flap may be configured to correspond to a neutral position at which the flap rests when the air pressure differential is approximately zero. The flap may rest at the neutral position as a result of the effect of gravity.

In another embodiment, the air passage of the conduit is in fluid communication with an air containment zone and an ambient air zone. The air containment zone and the ambient air zone are otherwise substantially isolated from each other.

In yet another embodiment, the processing unit may be further configured to regulate a balance of air flowing between the air containment zone and the ambient air zone based on the air pressure differential.

Another aspect of the present disclosure is directed to a method for determining an air pressure differential. In one embodiment, the method includes projecting a beam of light towards a reflective surface of a movable member that moves in response to air flowing through an air passage. The air flow is induced by the air pressure differential. The method further includes detecting the beam of light after it has been reflected from the reflective surface of the movable member with at least one of a plurality of light detectors. The air pressure differential is determined based upon the detected beam of light.

In another embodiment, the air passage is in fluid communication with an air containment zone and an ambient air zone. The air containment zone and the ambient air zone are otherwise substantially isolated from each other. The method may further comprise regulating a balance of air flowing between the air containment zone and the ambient air zone based on the air pressure differential.

According to one embodiment, the movable member moves to a determinative position in response to the air flowing through the air passage. The determinative position may be a function of the air pressure differential. The movable member may rest at a neutral position when the air pressure differential is approximately zero.

In another embodiment, each of the light detectors corresponds to one of a plurality of predetermined air pressure differential values. The air pressure differential may be determined by identifying which of the predetermined air pressure differential values correspond to the light detector or light detectors that detect the beam of light.

The present disclosure will be more fully understood in view of the following drawings, detailed description, and claims.

BRIEF DESCRIPTION OF THE DRAWINGS

In the drawings, each identical or nearly identical component that is illustrated in various figures is represented by a like numeral. For purposes of clarity, not every component may be labeled in every drawing. For a better understanding of the present disclosure, reference is made to the figures which are incorporated herein by reference and in which.

DETAILED DESCRIPTION OF THE INVENTION

Figure 1:
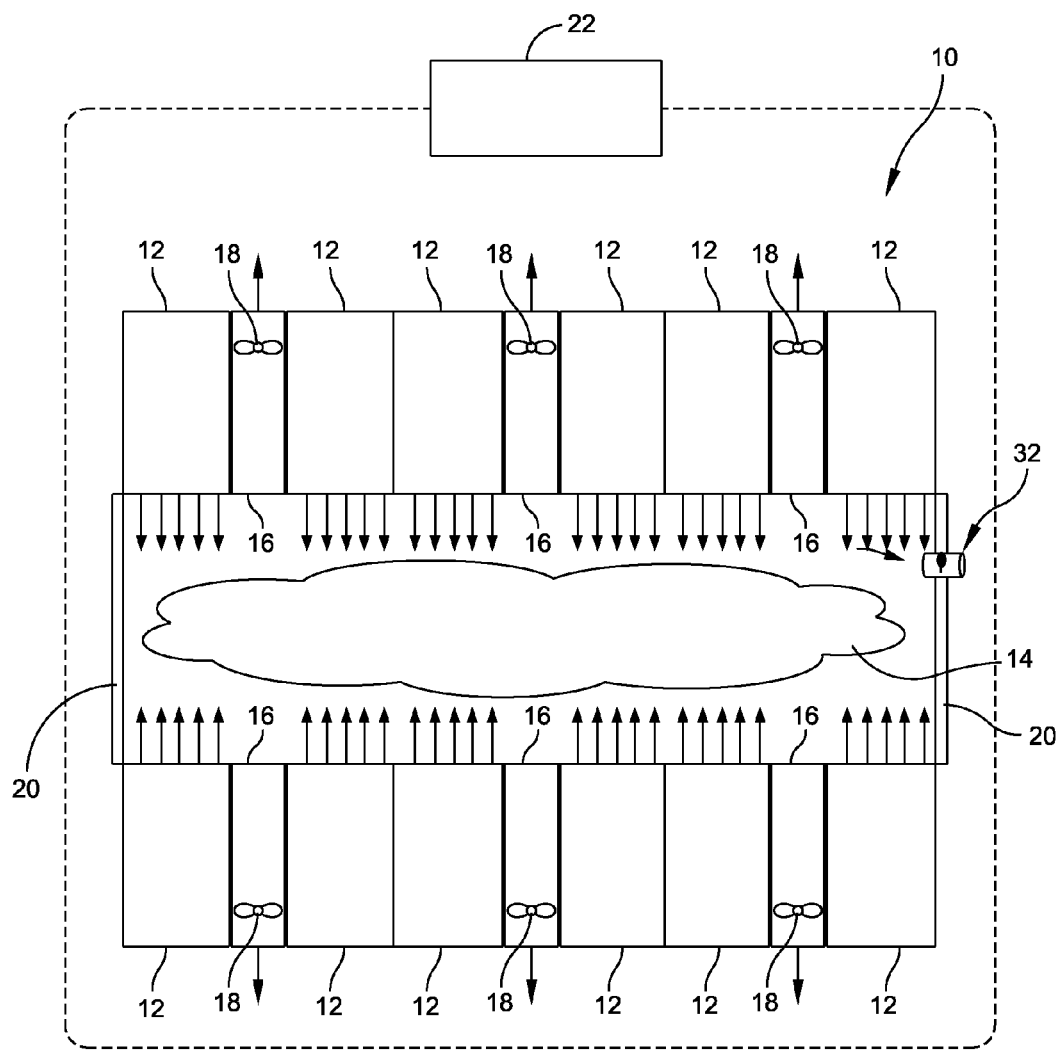
FIG. 1 is a schematic top plan view of a portion of a data center employing an air pressure differential detecting system in accordance with one embodiment of the disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof, as well as additional items.

A typical data center may house many equipment racks, for example, equipment racks sold by American Power Conversion Corporation of West Kingston, R.I., under the brand name NetShelter™. Each equipment rack may be configured to include a frame or housing adapted to support electronic equipment, such as computing, networking, and telecommunications equipment. The equipment racks are modular in construction and configurable in rows, which may be arranged such that cool air is drawn through the front of each rack, and air heated by the equipment within the racks is exhausted through the back of each rack. The rows may be further arranged such that the back of each rack in one row faces the back of each rack in another row, or a facility wall, with some space in between the rows or walls to allow for air circulation. Such a space is sometimes referred to as a "hot aisle" because it loosely contains the warm or hot air exhausted by the rows of equipment racks. The space in front of each row of racks is sometimes referred to as a "cool aisle" because it provides a source of cool air that is drawn into each rack. The data center may include a cooling system designed to generate chilled air for managing the operating temperature of the equipment and the data center environment.

When equipment racks are arranged within an open space, air from the hot aisle can mix with air in the cool aisle, thus increasing the temperature of the air provided in the cool aisle. This may result in the data center cooling system having to produce additional chilled air to compensate for the increased temperatures in the cool aisle, and thus decreasing the efficiency of the data center cooling system. Therefore, it is desirable to stringently contain the air in the hot aisle so as to prevent such mixing from occurring, and also to avoid feeding the cooling system with excessively warm or hot air. It is known to enclose the hot aisle with a containment system to establish an air containment zone for isolating the hot aisle from the cool aisle and the ambient air of the data center. One containment system includes ceiling and wall assemblies that are designed to mount to one or more rows of equipment racks for containing the air in the hot aisle. Accordingly, warm or hot air exhausting from the equipment racks will be trapped in the air containment zone and inhibited from mixing with the ambient air. This trapped air may be managed separately from the ambient air, for example by removing the hot air from the data center through an exhaust conduit, chimney, or other air circulation device. Alternatively, the hot air may be recirculated through the data center cooling system in controlled volumes and at controlled rates.

According to one embodiment of the present disclosure, when an air containment zone is established using an air containment system, such as described below with reference to FIG. 1, it may be desirable to monitor the amount of air, rate of air, or both flowing from the hot aisle into the cool aisle, or ambient air space. By monitoring the air flow between the ambient air zone, which is the zone outside of the air containment zone, and the air containment zone, the data center cooling system can be managed to optimize its energy efficiency. In particular, because air circulating through the equipment racks is forced into the confined space of the air containment zone, the air pressure in the air containment zone will be higher than the air pressure outside of the containment zone. A certain amount of air is drawn out of the containment zone to reduce the air pressure within the containment zone, and to enable cool air to flow into the equipment racks. The air pressure differential between the ambient air zone and the air containment zone may be used to calculate the volume, rate, or both, of air flowing from one zone to another. For example, an ideal air flow, with respect to energy efficiency, cooling requirements, or other variables, may be determined based on certain factors, such as the desired temperature of air in the cool aisle, the measured temperature of the air in the hot aisle, and other factors. Thus, it is appreciated that the air flow may be managed by measuring the air pressure differential between the ambient air zone and the air containment zone. One technique for detecting an air pressure differential is described in U.S. Patent Publication No. 2010-0186517, entitled METHOD AND SYSTEM FOR DETECTING AIR PRESSURE NEUTRALITY IN AIR CONTAINMENT ZONES, filed on Jan. 28, 2009, which is owned by the assignee of the present disclosure and is fully incorporated herein by reference.

FIG. 1 is a schematic top plan view of a portion of a data center employing an air pressure differential detecting system in accordance with one embodiment of the disclosure. Generally indicated at 10 is a portion of a data center, which includes a plurality of equipment racks, each indicated at 12. Each equipment rack 12 may house electronic equipment, such as computers, servers, telecommunications switches, network routers, and the like. The equipment racks 12 are arranged in rows such that one side (e.g., the backside) of each row of racks faces the same side (e.g., the backside) of the opposing row of racks. The air space between each pair of rows may define a hot aisle 14, so called because of the warm or hot air, generated by the equipment, which is expelled from the backside of each rack into the air space. The hot aisle 14 may further be enclosed by an air containment system so as to isolate the air therein from the rest of the data center 10 (e.g., the ambient air). In one arrangement, cool air enters the front side of each rack, is drawn through to cool the equipment in the rack, and exhausted as warm or hot air into the hot aisle 14.

One or more cooling units, each indicated at 16, may be disposed in between the equipment racks 12 to provide chilled air for cooling the equipment, for reducing the amount of heat within the hot aisle 14, or both. For example, the cooling units 16 may be configured to draw warm air from the hot aisle 14 through the backs of the cooling units, cool the warm air, and exhaust the cooled air through the fronts of the cooling units into the data center 10. Air flow through the cooling units 16 may be supplemented by one or more fans 18.

The hot aisle 14 may be enclosed by a physical boundary, including, for example, a ceiling, walls, or both, such as panels indicated at 20 in FIG. 1, which forms a containment zone for the air in the hot aisle 14. Each equipment rack 12 draws relatively cool air from the ambient air zone surrounding the front of the equipment racks 12. The desired airflow rate of any given equipment rack 12 is dependent upon the equipment, the ambient air temperature, the heat output by the equipment, and other factors, and may vary substantially over time. The combined net airflow through all equipment racks and into the air containment zone is highly variable and difficult to predict. Therefore, it is desirable to manage the rate and direction of air flow by extracting a certain amount of air from the air containment zone, creating a slight negative air pressure therein, to minimize the amount of hot air escaping from the air containment zone into the ambient air zone through backpressure. This further produces an air pressure differential that will naturally force cool air from the ambient air zone through the racks. Energy economy can be achieved by operating the cooling units 16 to remove and cool air from the air containment zone at a rate slightly greater than the rate of hot air entering the air containment zone from the equipment racks 12, as illustrated by the arrows in FIG. 1.

A calibrated leak may be created between the air containment zone and the ambient air zone using an air pressure differential detecting device, as disclosed herein, or other airflow detection systems, placed across the boundary between the two zones. In essence, the device permits a regulated amount of air to flow between the two zones, and measures the volume, rate, or both of the air flow. These measurements may be used by a controller configured to control the operation of the cooling units 16, the fans 18, or both, using a control algorithm to maintain a desired air flow between the air containment zone and the ambient air zone.

A controller 22 may be provided to control the operation of the equipment racks 12, the cooling units 16, or both. The controller 22 is illustrated schematically as being able to control all of the components of the data center 10, including component for managing air flow and cooling of the equipment.

Figure 2:
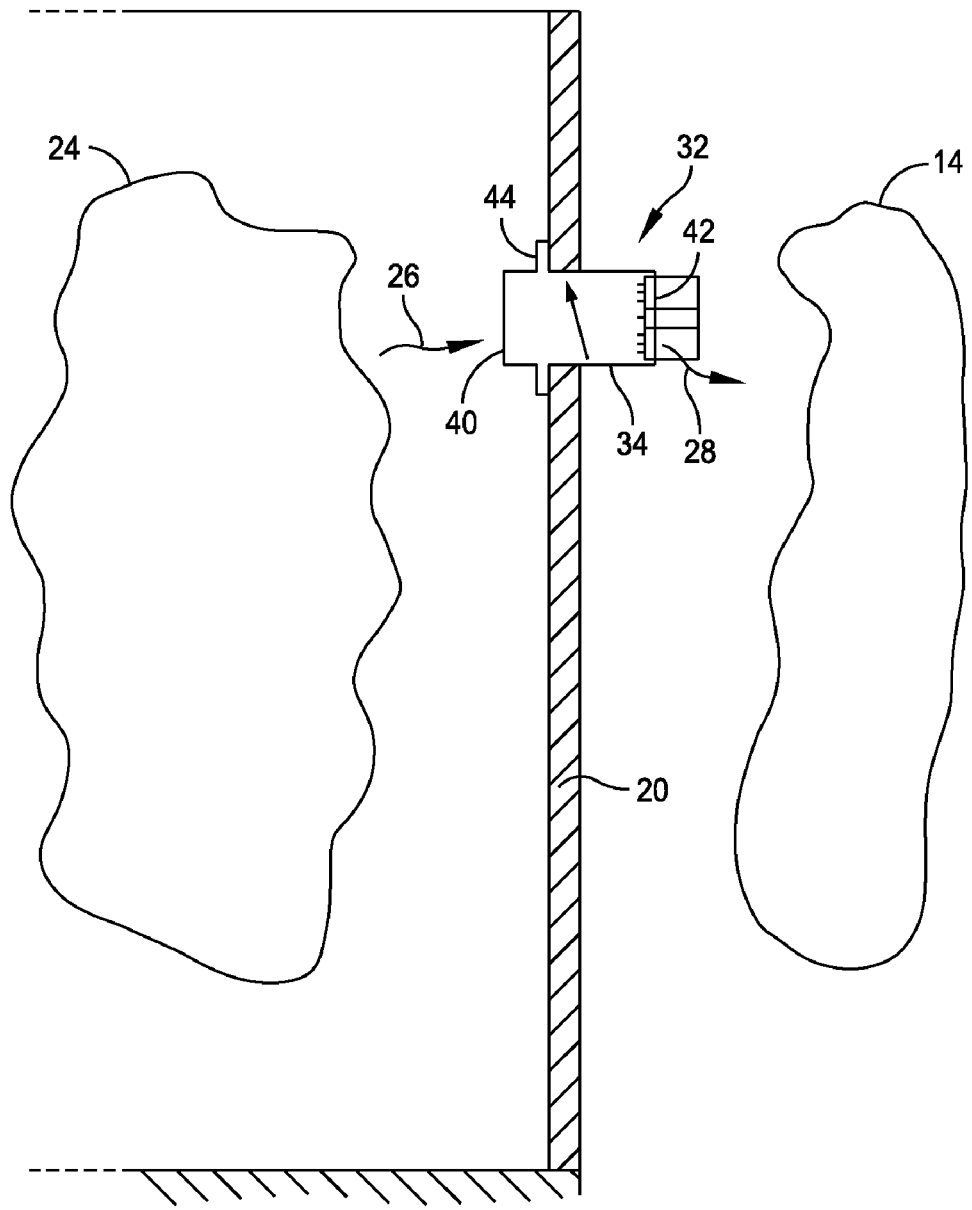
FIG. 2 is a schematic elevational view of an air pressure differential detecting system in accordance with another embodiment of the disclosure.

FIG. 2 illustrates one embodiment of an air pressure differential detecting system 32. The system 32 is disposed within the wall 20 of the hot aisle 14. The wall 20 defines a physical boundary separating the hot aisle 14 from an ambient air zone 24, and forms a portion of an air containment system. Thus, the system 32 may provide an air flow passage across the boundary between regions of air having potentially different pressures. Alternatively, the system 32 may be disposed within the sides or backs of one or more equipment racks 12, or in any suitable location within the data center 10 where a physical boundary substantially isolates the hot aisle 14 from the ambient air zone 24.

When the air pressure in the air containment zone, including the hot aisle 14, is less than the air pressure in the ambient air zone 24, cool air from the ambient air zone enters the air pressure differential detecting system 32 at a first open end 40 of a body 34, as indicated by arrow 26. The cool air flows through the body 34 and exits to the hot aisle 14 at a second open end 42 of the body, as indicated by arrow 28, while the air pressures in each zone naturally attempt to reach equilibrium. Air may also flow in the opposite direction, entering the second open end 42 of the body 34, and exiting the first open end 40, for example, when the air pressure in the hot aisle 14 exceeds the air pressure in the ambient air zone 24. The air pressure differential detecting system 32 may include a flange 44 for securing the body 34 to the wall 20 using, for example, mechanical fasteners, adhesives, or other attachment devices. Other embodiments of the air pressure differential detecting system 32 will now be described in further detail.

Figure 3:
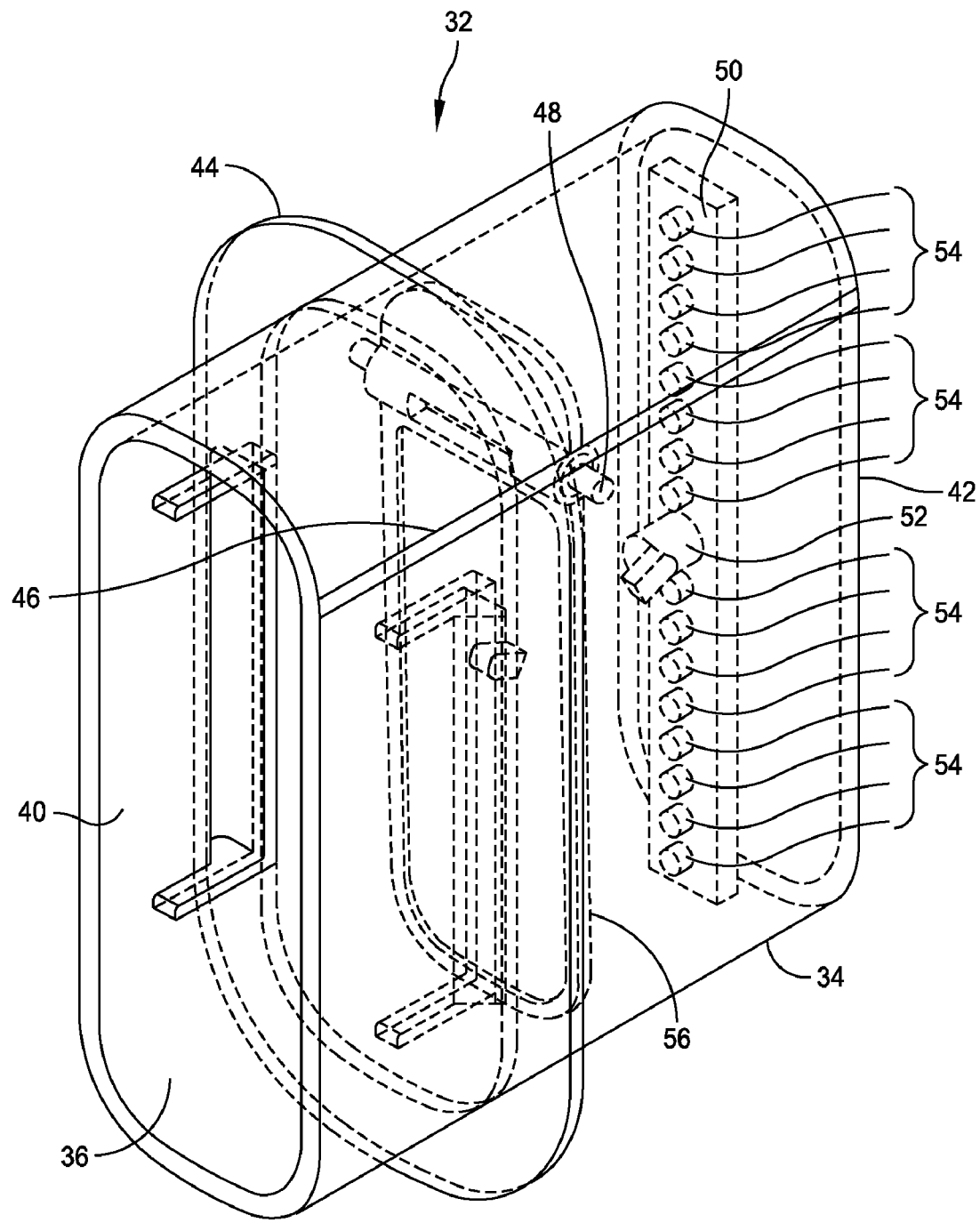
FIG. 3 is a perspective view of an air pressure differential detecting system in accordance with yet another embodiment of the disclosure.

FIG. 3 illustrates a perspective view of an embodiment of the air pressure differential detecting system 32. A body 34 forms a conduit 36, or inner surface of the body, which defines an air passage through which air flows upon application of an air pressure differential across different regions of the air passage. It should be understood that the conduit 36 may be formed as a tube or passageway that is not necessarily straight (e.g., the conduit may include one or more bends). The flange 44 surrounds the body 34 and may be used to secure the body to a wall or other barrier. The conduit 36 includes at least two openings, including the first open end 40 and the second open end 42 of the body 34 to facilitate a fluid communication between different regions of air, such the ambient air zone 24 and an air containment zone (e.g., the hot aisle 14). The air pressure differential detecting system 32 further includes a flap 46 that is mounted to the body 34 with a hinge 48. The flap 46 is configured to substantially block the air passage through the conduit 36 when in a closed orientation, and is also configured to move about an axis of the hinge 48 to allow varying volumes of air to pass through the air passage. Air passing through the air passage will cause the flap 46 to deflect from the closed orientation by rotating about the hinge 48.

Figure 5:
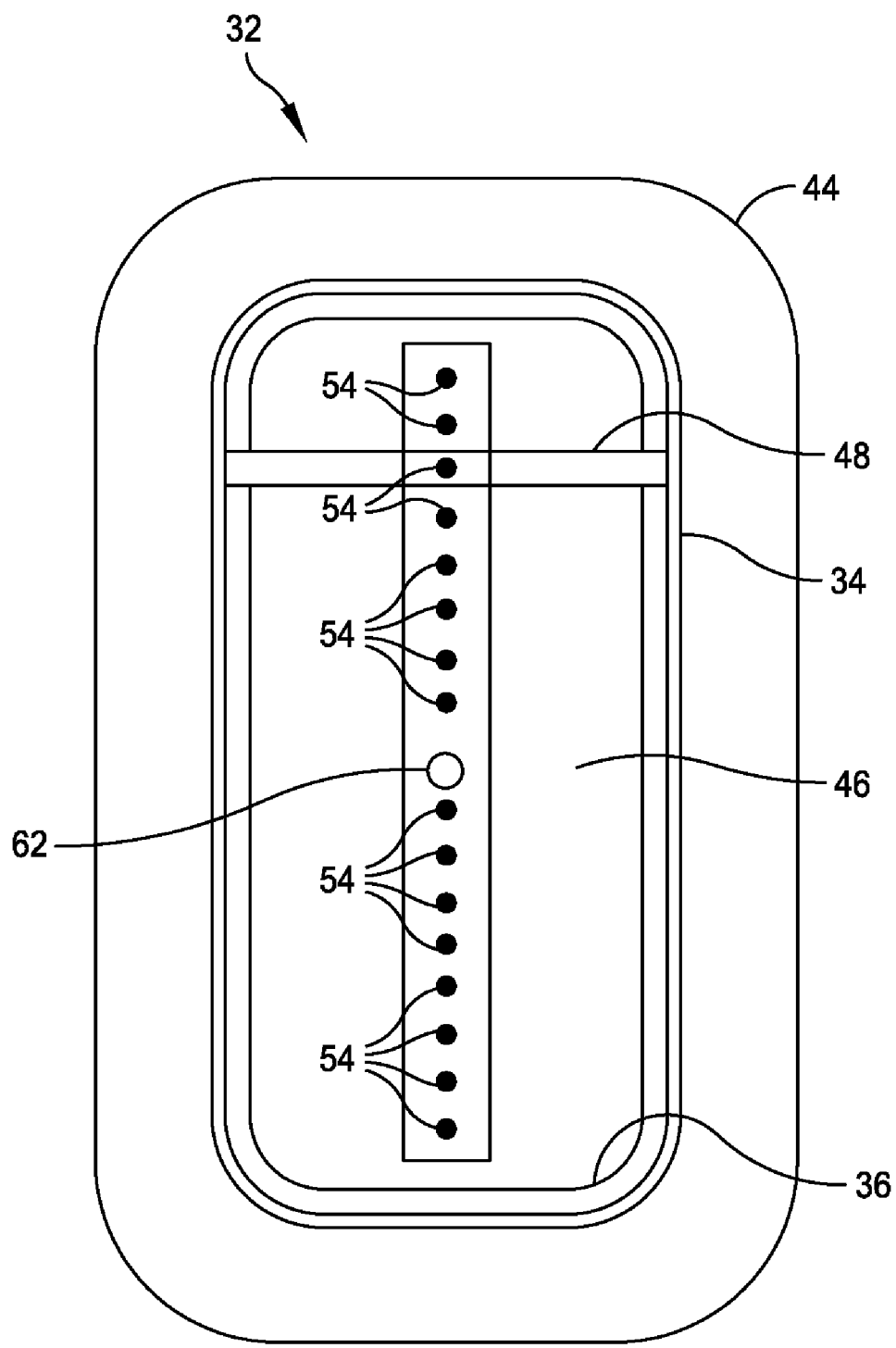
FIG. 5 is an end view of an air pressure differential detecting system in accordance with an embodiment of the disclosure.
Figure 6:
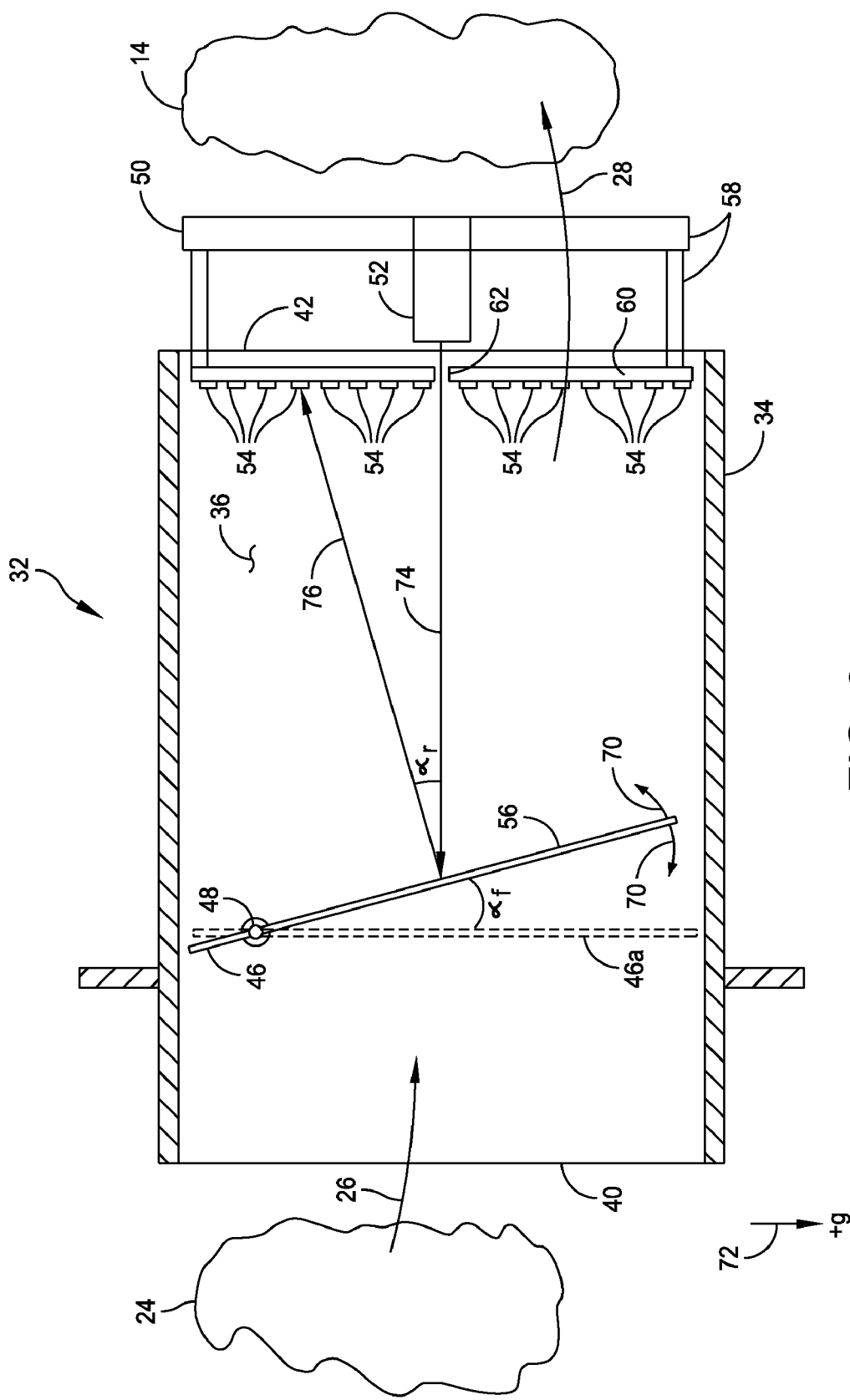
FIG. 6 is a cross-sectional view of an air pressure differential detecting system in accordance with an embodiment of the disclosure.

The air pressure differential detecting system 32 further includes a sensing device 50 for sensing an air pressure differential. The sensing device 50 includes a light source 52, which may be a laser, and a plurality of light detecting devices 54. Each of the light detecting devices 54 may be photodiodes, LEDs, or other photo-stimulated receiving devices. In one embodiment, each of the light detecting devices 54 are arranged in a row, as shown in FIGS. 3 and 5, although it will be understood that other arrangements and numbers of light detecting devices may be utilized. The light source 52 is configured to irradiate at least a portion of a surface 56 of the flap 46 with light. For example, the light source 52 may project a beam of laser light onto the surface 56. Further, the surface 56 has light-reflective properties, such as a reflective coating, decal, or other reflective material, such that at least some of the light reaching the surface from the light source 52 is reflected off of the surface. The light will be reflected off of the surface 56 at an angle of reflection that corresponds to the angle of incidence of the light arriving from the light source 52, according to the law of reflection, which further corresponds with the angle of deflection of the flap caused by air flowing through the air passage. This principle is illustrated in FIG. 6, and described below. The reflected light may be detected by one or more of the light detecting devices 54. Which of the light detecting devices 54 detects the reflected light is a function of the angular position of flap 46, and light detected by the light detecting devices may be used to determine an air pressure differential, as will be discussed below.

Figure 4:
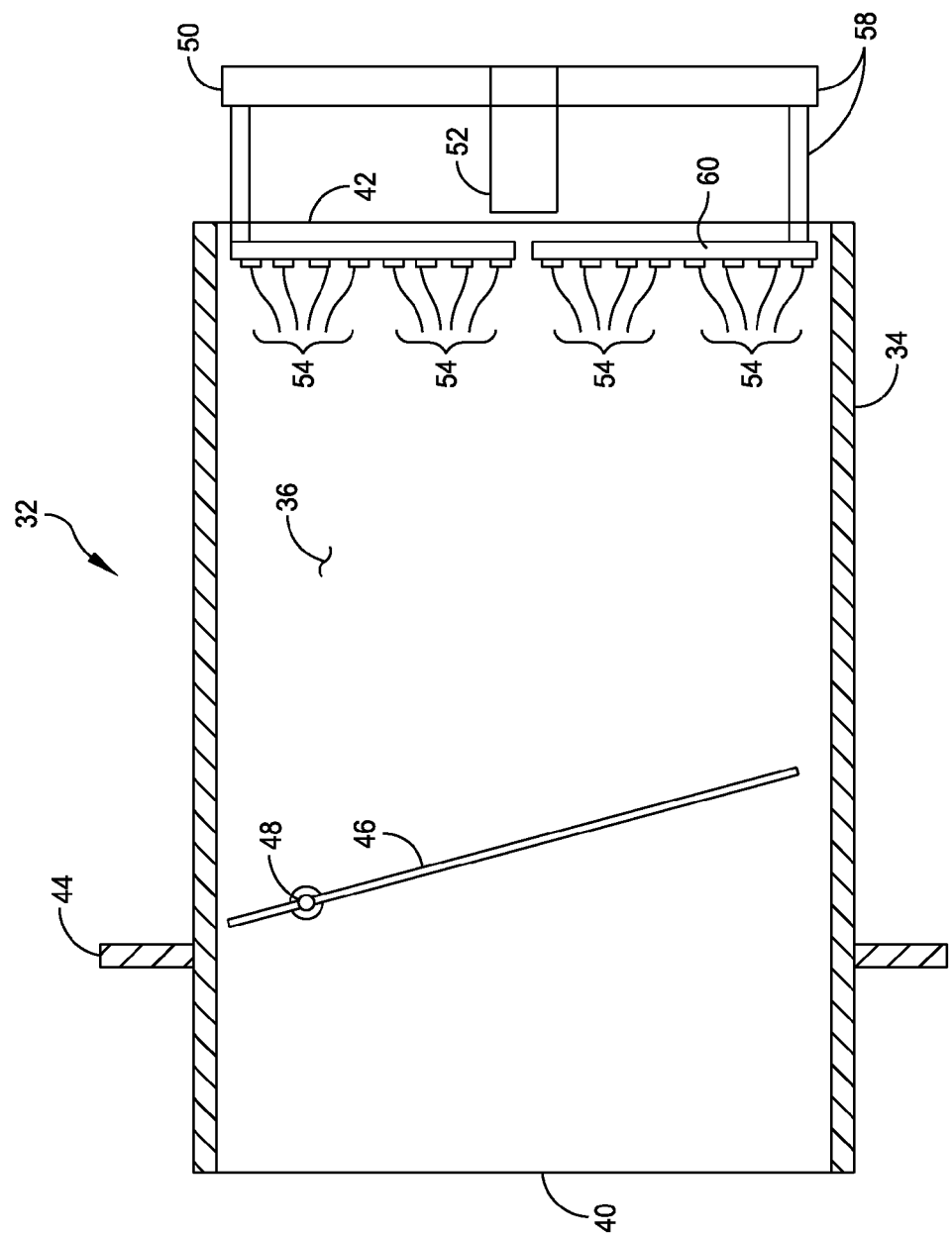
FIG. 4 is cross-sectional view of an air pressure differential detecting system in accordance with another embodiment of the disclosure.

FIG. 4 shows a cross-section elevation view of one embodiment of the air pressure differential detecting system 32, and FIG. 5 shows an end view of the system, with the flap 36 shown in outline only to permit illustration of other elements. The system 32 includes the body 34 which defines the conduit 36. The conduit 36 defines the air passage through which air may flow from the first open end 40 to the second open end 42 of the body, or in the opposite direction. The system 32 further includes the flange 44 for mounting the body 34 to a wall or other barrier. It should be appreciated that the flange 44 is merely representative of one type of mounting mechanism, and that other mounting mechanisms, such as tabs, clamps, or collars, may be employed with similar effectiveness depending on the application. The sensing device 50 is mounted proximate to the conduit 36, and includes the light source 52 and the plurality of light detecting devices 54, such as the light detecting devices described above with reference to FIG. 3. The sensing device 50 may include a support bracket 58 for mounting the light source 52 and a substrate 60 together and to the body 34 or other mounting point. Further, the light detecting devices 54 are mounted to the substrate 60, which may include an opening 62 formed through the substrate to allow light from the light source 52 to pass through the substrate and into the air passage. The sensing device 50 may include an electrical connection to provide power and control signals to the sensing device from, for example, a control unit (not shown).

FIG. 6 is a functional schematic diagram of one embodiment of the air pressure differential detecting system 32, and is not drawn to scale. Shown is the body 34 and the conduit 36 that defines the air passage through with air may flow between the first open end 40 of the body 34 and the second open end 42. The system 32 includes the flap 46 mounted to the body 34 with the hinge 48, which enables the flap to rotate freely about an axis of the hinge, as shown by arrow 70. The flap 46 is mounted within the conduit 36. The flap 46 may be made of a light-weight, rigid material or another suitable material. Also shown are the ambient air zone 24 and the air containment zone 14, or hot aisle, each located opposing the first open end 40 and the second open end 42 of the body 34, respectively. When the body 34 is mounted in a wall or other barrier (not shown) that isolates the air containment zone 14 from the ambient air zone 24, any uncontrolled air exchanged between these two zones is forced to pass through the air passage of the system 32.

As described above, in one example, heated air is typically pumped into the hot aisle by cooling fans located on each piece of equipment, fans located on equipment racks, and/or from elsewhere in the data center, such as from a cooling system that may be located in the data center, within or between the equipment racks, or both. The action of forcing air into the hot aisle, which is isolated from the rest of the area by an air containment system, such as the air containment system described above with reference to FIG. 1, causes the air pressure in the air containment zone 14 to increase relative to the outside environment, including the ambient air zone 24. The amount of the pressure increase is a function of the volume and rate of air entering the air containment zone 14 relative to the volume and rate of air exiting the air containment zone, as well as temperature, atmospheric pressure, the normal force exerted by the air, and other factors. Because the air containment system may be configured to be substantially airtight, with only limited paths for air to escape therefrom, the air passage defined by the conduit 36 may be the only path for air to exit from the air containment zone 14 to the ambient air zone 24. It should be understood, however, that other exit paths may be utilized in addition to the conduit 36, for example, when a controlled amount of air is removed from the hot aisle for recirculation into the ambient air zone, or to the outside of the data center.

Accordingly, because fluidly coupled regions of differing air pressures naturally seek an equilibrium, air will flow between the air containment zone 14 and the ambient air zone 24 whenever there is an air pressure differential between the two zones. The direction of air flow is dependent upon which zone contains the higher air pressure, as air having a relatively high pressure will flow towards a region of relatively low pressure. In one example, this is illustrated by arrows 26 and 28, which shows paths along which air may flow from the ambient air zone 24 to the air containment zone 14 when the air pressure in the ambient air zone exceeds the air pressure in the air containment zone.

When the air pressures within the air containment zone 14 and the ambient air zone 24 are at equilibrium, no air will flow through the system 32. This may be referred to as a "neutral" or "at rest" state. In one embodiment, the body 34 is installed such that it is oriented perpendicular to the force of gravity (indicated at 72). The flap 46 and the hinge 48 may be configured such that the flap rotates freely, or with substantially little resistance, about the hinge. In the illustrated configuration, the weight of the flap 46 will cause the flap to rest at a neutral position, represented by broken lines at 46a, in the absence of any airflow through the air passage. The flap 46 may be configured such that, when it is at rest, the air passage is substantially "closed" or blocked. In other words, any air attempting to pass through the air passage will be substantially blocked by the flap 46 when it is in the neutral position, although the air passage will not necessarily be airtight.

When an air pressure differential exists between the air containment zone 14 and the ambient air zone 24, air will naturally seek to flow through the air passage of the system 32, as described above. For example, if the air pressure in the ambient air zone 24 is greater than the air pressure in the air containment zone 14, air will attempt to flow from the ambient air zone, into the conduit 36 through the first open end 40, and out through the second open end 42 into the air containment zone. As described above, the flap 46 substantially blocks the air passage when at rest. Thus, the air flow will exert a force against flap 46 as it attempts to flow through the air passage, causing the flap to deflect and rotate about the hinge 48. The degree to which the flap 46 deflects is a function of the air flow rate and other factors, such as the weight of the flap and the amount of resistance force applied by the flap against the air. Typically, the flap 46 is constructed of a rigid and light-weight material to enable a wide range of rotational motion within a small range of air flow rates. Further, materials and the configuration of the flap 46 may be selected in a manner that will allow the amount of rotational motion to be calibrated for a particular application, which may depend on the size and the designed air flow capacity of the system 32.

Figure 7:
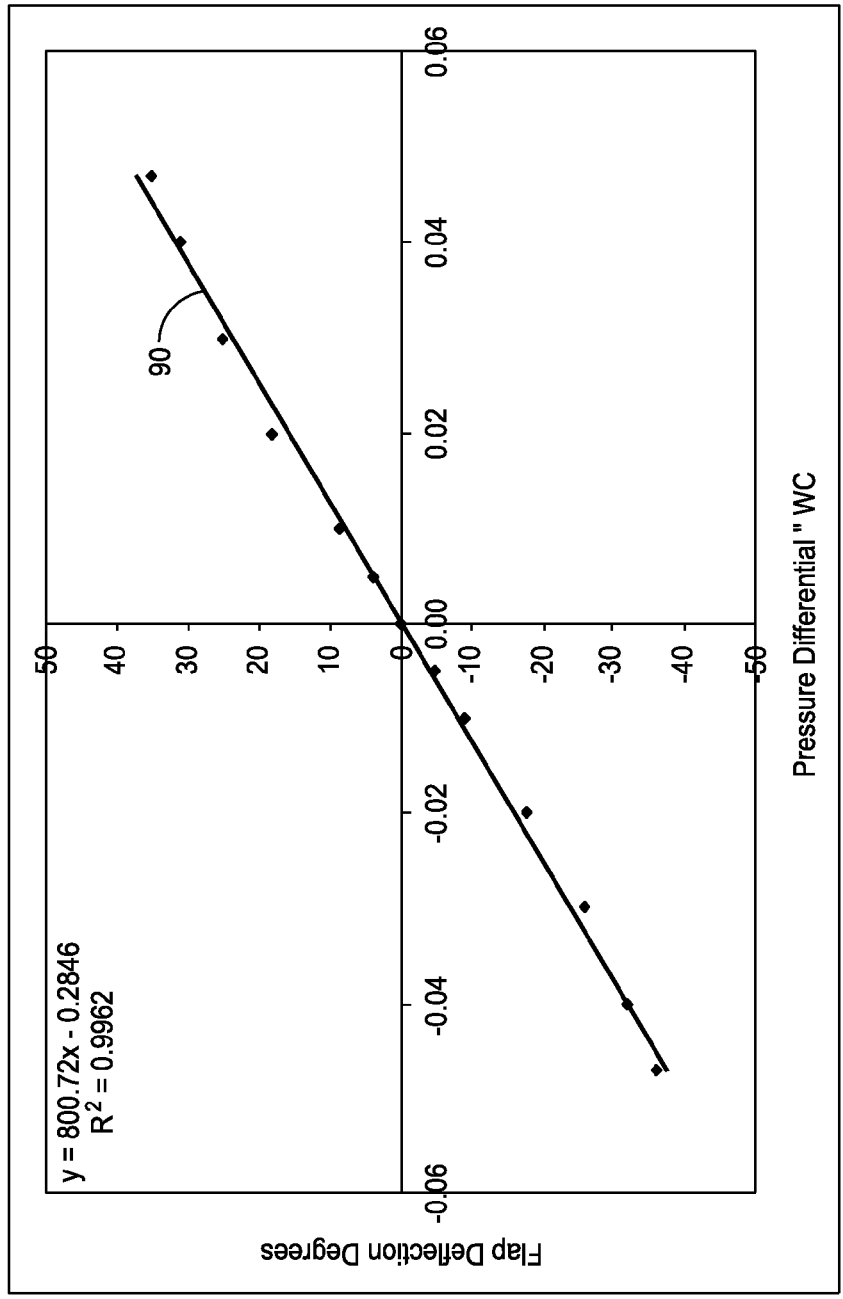
FIG. 7 is a chart illustrating a flap deflection angle as a function of an air pressure differential applied across an air pressure differential detecting system in accordance with one embodiment of the disclosure.

One example of a flap deflection function in accordance with an embodiment is illustrated in FIG. 7. In the chart, a pressure differential (e.g., between an air containment zone and an ambient air zone) is shown on the horizontal axis in inches of water column, and a flap deflection angle is shown on the vertical axis in degrees of rotation relative to a neutral position (e.g., zero degrees). In this example, the flap defection function is shown as a plot line 90, which is substantially linear, although other functions may be utilized. As can be seen in FIG. 7, in one embodiment, the flap may deflect through a range between approximately −35 degrees and +35 degrees in response to a differential air pressure ranging between approximately −0.06 inches and +0.06 inches of water column. It will be appreciated that the present disclosure should not be limited to the examples cited herein, and that an air pressure differential detecting system utilizing the techniques described herein may be adapted for a variety of differential air pressure ranges in various configurations and adaptations thereof.

Referring again to FIG. 6, the system 32 further includes the sensing device 50, such as the sensing device described above with respect to FIG. 4. The sensing device 50 includes the light source 52 and the plurality of light detectors 54 mounted on the substrate 60 having the opening 62 therein located at approximately the vertical midpoint of the substrate. The opening 62 is aligned with the light source 52 such that light emitted by the light source may pass substantially unobstructed through the opening to irradiate the surface 56 of the flap 46, as shown by arrow 74. The light is reflected off of the surface 56 of the flap 46, as shown by arrow 76. The reflected light travels at a light reflection angle $\alpha_r$ with respect to the light beam 74. The light reflection angle $\alpha_r$ corresponds to a flap deflection angle $\alpha_f$. According to the law of reflection and geometric principles, $\alpha_r = 2\alpha_f$. This is because the angle of incidence (not identified) of the light beam 74 to the surface 56 of the flap 46, which corresponds to the flap deflection angle $\alpha_f$, equals the angle of reflection with respect to a normal (e.g., perpendicular) angle of incidence (also not identified). As can be seen in the drawing, the light reflection angle $\alpha_r$ is a function of the degree of flap deflection caused by air flowing through the air passage.

Also shown in FIG. 6 is one example of light emitted by the light source 52 reflecting off of the surface 56 towards one or more of the light detectors 54. Thus, one or more light detectors 54 may detect the reflected light, depending on the light reflection angle $\alpha_r$, the configuration of the light detectors, and other factors. Accordingly, the flap deflection angle $\alpha_f$ can be determined based on which of the light detectors 54 detects the reflected light. For example, a first light detector may detect a flap deflection angle of approximately two degrees; a second light detector, six degrees, and so forth. The resolution of the sensor device 50 may be set by adjusting the number of light detectors, the spacing of the light detectors, or both, located on, for example, the substrate 60. For example, if the light sensors are placed closely together, it will be possible to detect the flap deflection angle with greater precision. The sensitivity of the sensor device 50 may be set by adjusting a distance between the flap 46 and the plurality of light detectors 54. For example, if the light detectors 54 are placed closer to the surface 56 of the flap 46, the reflected light will be more focused (i.e., less scattered) upon the light detectors, improving the response and performance characteristics of the sensing device 50.

In addition to determining the flap deflection angle, an air pressure differential can be determined based on the flap deflection angle $\alpha_f$, for example, according to a known or calculated function such as described above with respect to FIG. 7. A value representing the determined air pressure differential may be presented to a control unit (not shown) for further processing (e.g., as a process variable for an airflow control algorithm within a data center cooling system). According to one embodiment, the resolution of the system 32 is approximately 0.005 inches of water column. This has been demonstrated to exhibit the required sensitivity at anticipated operating pressure differentials between air containment zones and ambient air zones within a typical data center.

Figure 8:
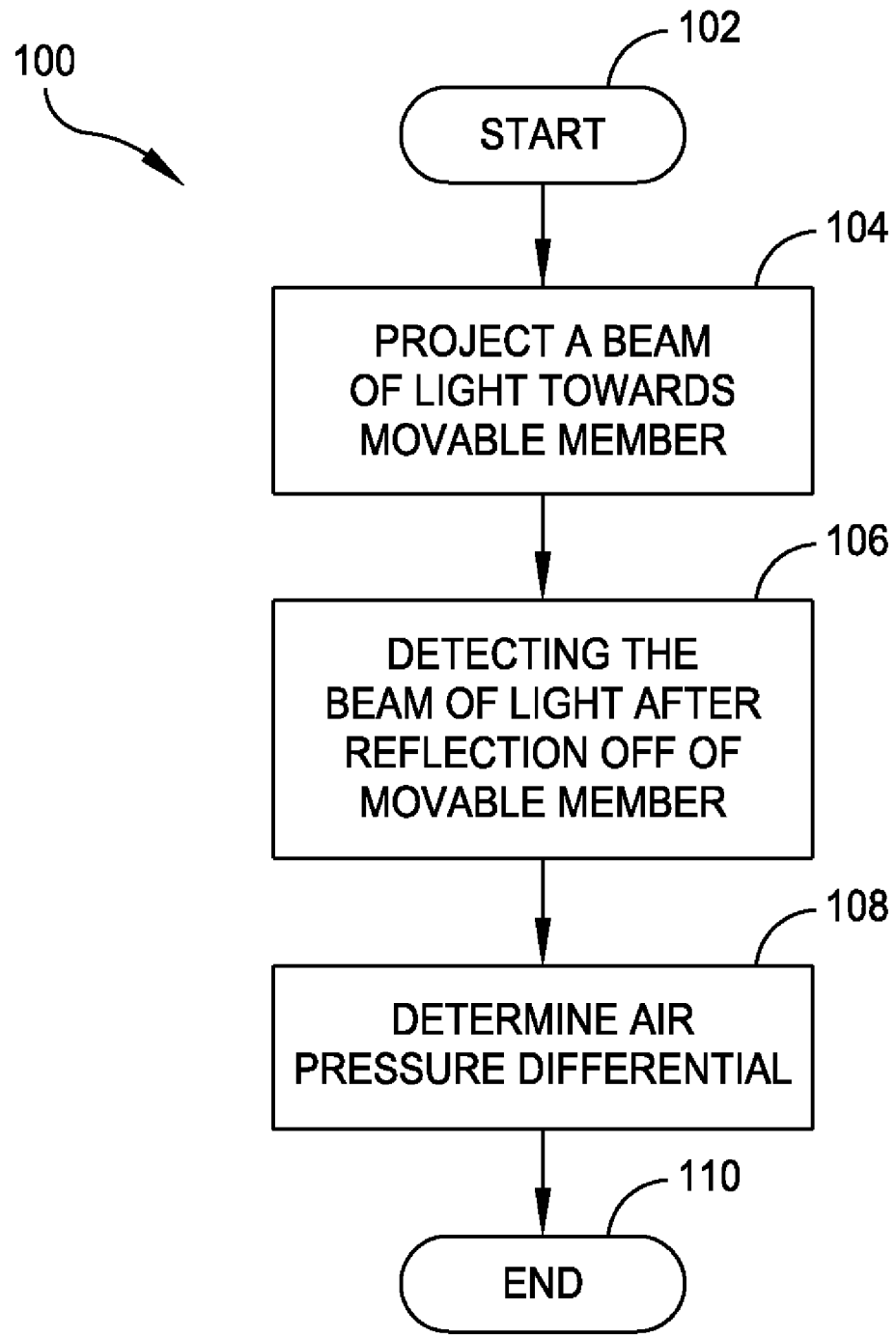
FIG. 8 is a flow diagram of an air pressure differential detecting method in accordance with one embodiment of the disclosure.

FIG. 8 illustrates a flow diagram for a method of determining an air pressure differential 100 in accordance with one embodiment of the disclosure. Method 100 begins at block 102. At block 104, a beam of light is projected towards a movable member. The beam of light may be, for example, a beam of laser light, or other light capable of being sufficiently powerful and focused for a particular application. The beam of light may optionally be another type of waveform, such as sonar, ultrasound, or other signals having directional properties.

The movable member may be, for example, a flap arranged within a conduit that is adapted to provide a passage for airflow therein, such as in the air pressure differential detecting system 32 described above with reference to FIG. 3. The movable member is configured to move in response to an air pressure differential across system 32, an air flow through the system, or both. It will be understood that the movable member may comprise other objects, including, but not limited to, wind vanes, propellers, wind socks, louvers, membranes, or other devices that are configured to move in response to an application of an air pressure differential, air flow, or both. The movable member includes a reflective surface adapted to reflect the beam of light off of it. The angle of the reflected beam of light relative to the projected beam of light is a function of the motion and position of the movable member.

At block 106, the beam of light is detected after it is reflected off of the movable member. The reflected beam of light may be detected, for example, by a sensor device such as sensor device 50 described above with respect to FIG. 3. Such a device includes a light source for generating the beam of light, and a plurality of light detectors arranged to detect the reflected beam of light at a plurality of locations. For example, the location of the reflected beam of light will vary according to the motion of the movable member, whereas each of the light detectors is configured to detect light at a fixed location. Accordingly, one or more of the light detectors may detect the reflected beam of light, depending on the position of the movable member and the angle of the reflected beam of light off of the reflective surface the movable member. When the movable member moves, the reflected beam of light correspondingly moves as well. In this manner, the position of the movable member may be determined based upon which of the one or more light detectors detects the reflected light.

At block 108, an air pressure differential is determined based on the detected beam of light. The air pressure differential may be determined using a function that relates the detected beam of light to one of a plurality of air pressure differential values, such as described above with respect to FIG. 7. Process 100 ends at block 110.

Having thus described at least one embodiment of the present disclosure, various alternations, modifications and improvements will readily occur to those skilled in the art. Such alterations, modifications and improvements are intended to be within the scope and spirit of the disclosure. For example, the flap described above may be replaced by any movable member that responds to air flowing through the conduit of the system and is configured to reflect light in a predictable direction. Further, the arrangement and orientation of the flap and sensing device with respect to one another and to the body may differ from the described embodiments, since the air pressure differential can be determined using alternative designs of the system (e.g., using an overhead sensing device rather than one located proximate to one end of the conduit). Accordingly, the foregoing description is by way of example only and is not intended to be limiting. The disclosure's limit is defined only in the following claims and equivalents thereto.

What is claimed is:

1. An air pressure differential sensing system comprising:
   a conduit defining an air passage through which air flows upon application of an air pressure differential across different regions of the air passage;
   a flap pivotally connected within the conduit, the flap being configured to move about a pivotal axis in response to the air flowing through the air passage; and
   a sensing device mounted proximate to the air passage and separate from the flap, the sensing device being configured to sense an angular position of the flap about the pivotal axis, the angular position of the flap being a function of the air pressure differential,
   wherein the air passage of the conduit is in fluid communication with an air containment zone and an ambient air zone, the air containment zone and the ambient air zone being otherwise substantially isolated from each other.

2. The system of claim 1, wherein the sensing device is further configured to sense the angular position of the flap about the pivotal axis by detecting reflected light from a surface of the flap.

3. The system of claim 2, wherein the sensing device comprises a light emitting unit configured to irradiate at least a portion of the surface of the flap with light.

4. The system of claim 3, wherein the light emitting unit includes a laser.

5. The system of claim 3, wherein the sensing device further comprises a plurality of light detectors for detecting the reflected light.

6. The system of claim 5, wherein at least one of the plurality of light detectors is a photodiode.

7. The system of claim 5, wherein the plurality of light detectors are arranged such that the sensing device senses the angular position of the flap within a range of angular positions of the flap.

8. The system of claim 7, wherein the range of angular positions of the flap corresponds to a range of air pressure differentials that is between approximately −0.060 inches of water column and approximately +0.060 inches of water column.

9. The system of claim 1, wherein the angular position of the flap corresponds to a neutral position at which the flap rests when the air pressure differential is approximately zero.

10. The system of claim 9, wherein the flap rests at the neutral position responsive to the effect of gravity thereupon.

11. The system of claim 1, further comprising a processing unit coupled to the sensing device and configured to determine the air pressure differential based upon the sensed angular position of the flap.

12. The system of claim 11, wherein the processing unit is further configured to regulate a balance of air flowing between the air containment zone and the ambient air zone based on the air pressure differential.

13. A method for determining an air pressure differential, the method comprising:
   projecting a beam of light towards a reflective surface of a movable member that moves in response to air flowing through an air passage, the air flow being induced by the air pressure differential;
   detecting the beam of light after it has been reflected from the reflective surface of the movable member with at least one of a plurality of light detectors; and
   determining the air pressure differential based upon the detected beam of light,
   wherein the air passage is in fluid communication with an air containment zone and an ambient air zone, the air containment zone and the ambient air zone being otherwise substantially isolated from each other.

14. The method of claim 13, further comprising regulating a balance of air flowing between the air containment zone and the ambient air zone based on the air pressure differential.

15. The method of claim 13, wherein each of the plurality of light detectors corresponds to one of a plurality of predetermined air pressure differential values.

16. The method of claim 15, wherein determining the air pressure differential includes identifying the one of the plurality of predetermined air pressure differential values that corresponds to the at least one of the plurality of light detectors that detects the beam of light.

17. The method of claim 16, wherein the movable member moves to a determinative position in response to the air flowing through the air passage, and wherein the determinative position is a function of the air pressure differential.

18. The method of claim 17, wherein the movable member rests at a neutral position when the air pressure differential is approximately zero.

19. An air pressure differential sensing system comprising:
   a conduit defining an air passage through which air flows upon application of an air pressure differential across different regions of the air passage;
   a flap pivotally connected within the conduit, the flap being configured to move about a pivotal axis in response to the air flowing through the air passage; and
   a sensing device mounted proximate to the air passage and separate from the flap, the sensing device being configured to sense an angular position of the flap about the pivotal axis, the angular position of the flap being a function of the air pressure differential, the sensing device further being configured to sense the angular position of the flap about the pivotal axis by detecting reflected light from a surface of the flap, the sensing device comprising a light emitting unit configured to irradiate at least a portion of the surface of the flap with light and a plurality of light detectors for detecting the reflected light, the plurality of light detectors being arranged such that the sensing device senses the angular position of the flap within a range of angular positions of the flap,
   wherein the range of angular positions of the flap corresponds to a range of air pressure differentials that is between approximately −0.060 inches of water column and approximately +0.060 inches of water column.

20. An air pressure differential sensing system comprising:
   a conduit defining an air passage through which air flows upon application of an air pressure differential across different regions of the air passage;
   a flap pivotally connected within the conduit, the flap being configured to move about a pivotal axis in response to the air flowing through the air passage;
   a sensing device mounted proximate to the air passage and separate from the flap, the sensing device being configured to sense an angular position of the flap about the pivotal axis, the angular position of the flap being a function of the air pressure differential; and a processing unit coupled to the sensing device and configured to determine the air pressure differential based upon the sensed angular position of the flap, the processing unit being further configured to regulate a balance of air flowing between the air containment zone and the ambient air zone based on the air pressure differential.

* * * * *